United States Patent [19]
Yu et al.

[11] Patent Number: 6,126,471
[45] Date of Patent: Oct. 3, 2000

[54] RETENTION MECHANISM

[75] Inventors: Hung-Chi Yu, Hsi-Chih; Shun-Chi Tung, Tu-Chen, both of Taiwan

[73] Assignee: Hon Hai Precision Ind. Co., Ltd., Taipei Hsien, Taiwan

[21] Appl. No.: 09/370,086

[22] Filed: Aug. 6, 1999

[30] Foreign Application Priority Data

Apr. 16, 1999 [TW] Taiwan .................................. 88205881

[51] Int. Cl.$^7$ ................................................... H01R 13/62
[52] U.S. Cl. ............................................................ 439/327
[58] Field of Search .................................... 439/327, 328, 439/325, 377; 361/801, 802

[56] References Cited

U.S. PATENT DOCUMENTS

| | | | |
|---|---|---|---|
| 5,650,917 | 7/1997 | Hsu ......................................... | 439/327 |
| 5,726,865 | 3/1998 | Webb et al. ............................. | 439/327 |
| 5,842,880 | 12/1998 | Pei ......................................... | 439/327 |
| 5,943,218 | 8/1999 | Liu ......................................... | 439/327 |

*Primary Examiner*—Gary F. Paumen
*Attorney, Agent, or Firm*—Wei Te Chung

[57] ABSTRACT

A retention mechanism comprises a base, a pair of arms and a pair of locking elements. The base forms a hollow slot for receiving a connector therein. The arms vertically extend from lateral ends of the base. Each arm forms a receiving slot for receiving a CPU package therein. A leading element is formed in each arm and a positioning slot is formed in each leading element. A guiding face is formed on a top of each leading element for facilitating insertion of the CPU package. Each locking element engages with a free end of the arm and a top edge of the CPU package for ensuring a reliable connection between the CPU package and the connector.

1 Claim, 5 Drawing Sheets

RETENTION MECHANISM

BACKGROUND OF THE INVENTION

The present invention relates to a retention mechanism, and particularly to a retention mechanism for securing a CPU package to a connector.

Generally, a conventional CPU package connects with a circuit board through a connector, and a large amount of the circuit board space is occupied by the CPU package. Recently, another connection type for vertically connecting the CPU package to the circuit board has been developed. A vertical retention mechanism is required to be used with such a connection type for securing the CPU package with a connector thereof. Related inventions are disclosed in Taiwan Patent Application Nos. 86207711; 86207803; and 86211054. The conventional retention mechanism comprises an elongate body and a pair of arms vertically extending from lateral ends of the body. Each arm forms a slot for receiving the CPU package therein. However, if a thickness of the CPU package is less than the width of the slot, the CPU package can not be properly positioned in the connector. Therefore, the connection between the CPU package and the connector is not reliable. Thus, an improved retention mechanism is needed for properly positioning the CPU package to a connector.

BRIEF SUMMARY OF THE INVENTION

A main object of the present invention is to provide a retention mechanism having a leading element for guiding a CPU package to a proper position for providing a reliable connection between the CPU package and a connector incorporating the retention mechanism.

To fulfill the above mentioned object, according to a preferred embodiment of present invention, a retention mechanism comprises a base, a pair of arms and a pair of locking elements. The base forms a hollow slot for receiving a connector therein. The arms vertically extend from lateral ends of the base. Each arm forms a receiving slot for receiving a CPU package therein. A leading element is formed in each arm and a positioning slot is formed in each leading element. A guiding face is formed on a top of each leading element for facilitating insertion of the CPU package. Each locking element engages with a free end of the arm and a top edge of the CPU package for ensuring a reliable connection between the CPU package and the connector.

Other objects, advantages and novel features of the invention will become more apparent from the following detailed description when taken in conjunction with the accompanying drawings.

DETAILED DESCRIPTION OF THE INVENTION

Figure 1:
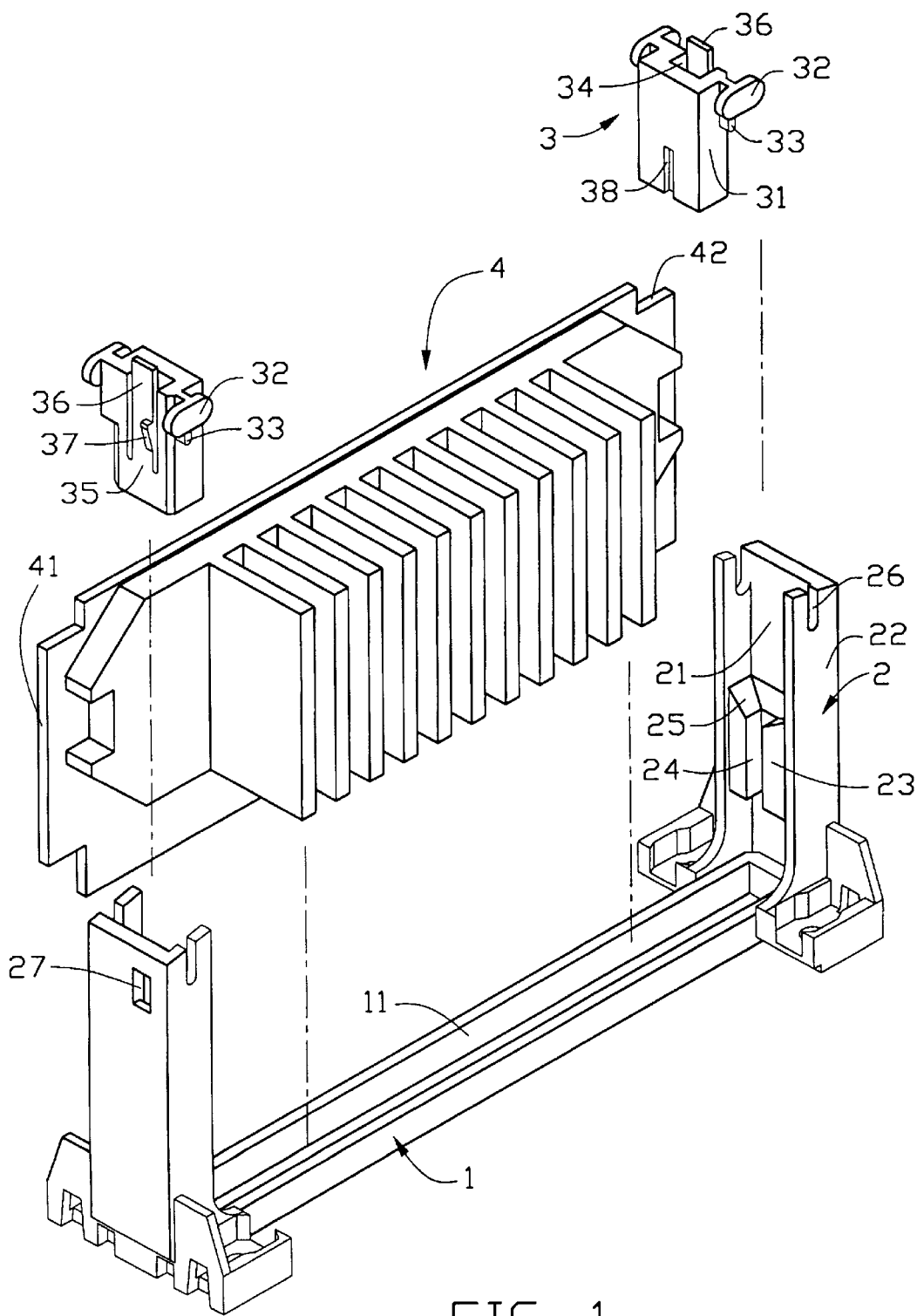
FIG. 1 is an exploded view of a retention mechanism and a CPU package in accordance with the present invention.
Figure 2:
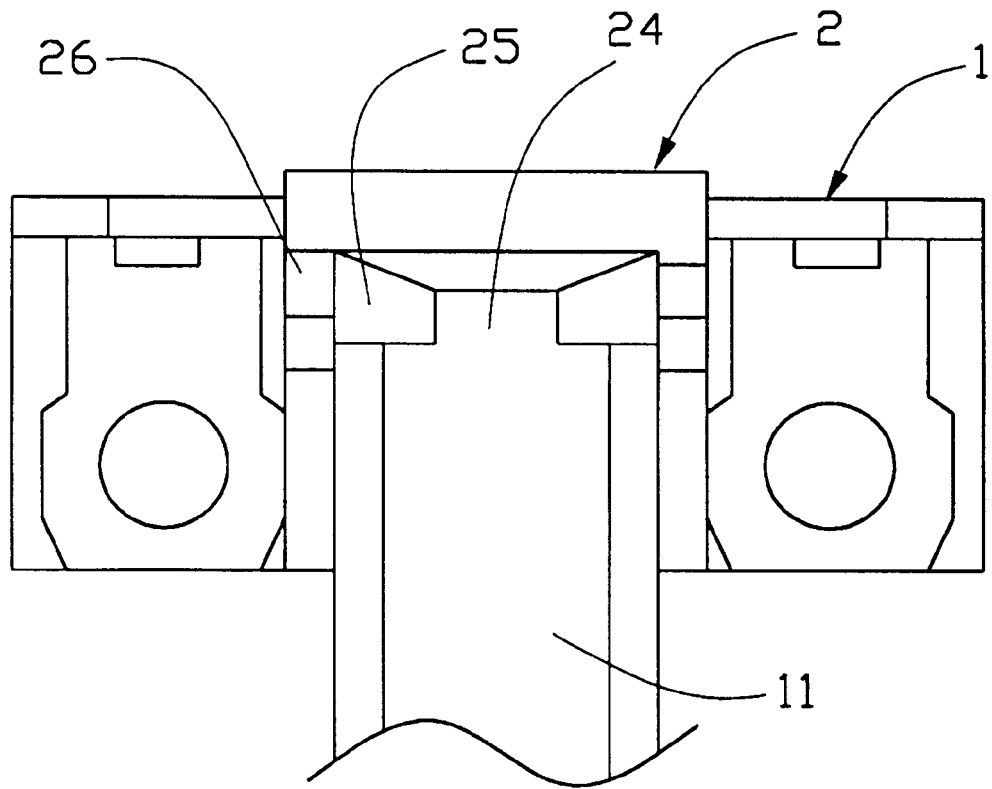
FIG. 2 is a partial top view of the retention mechanism.
Figure 3:
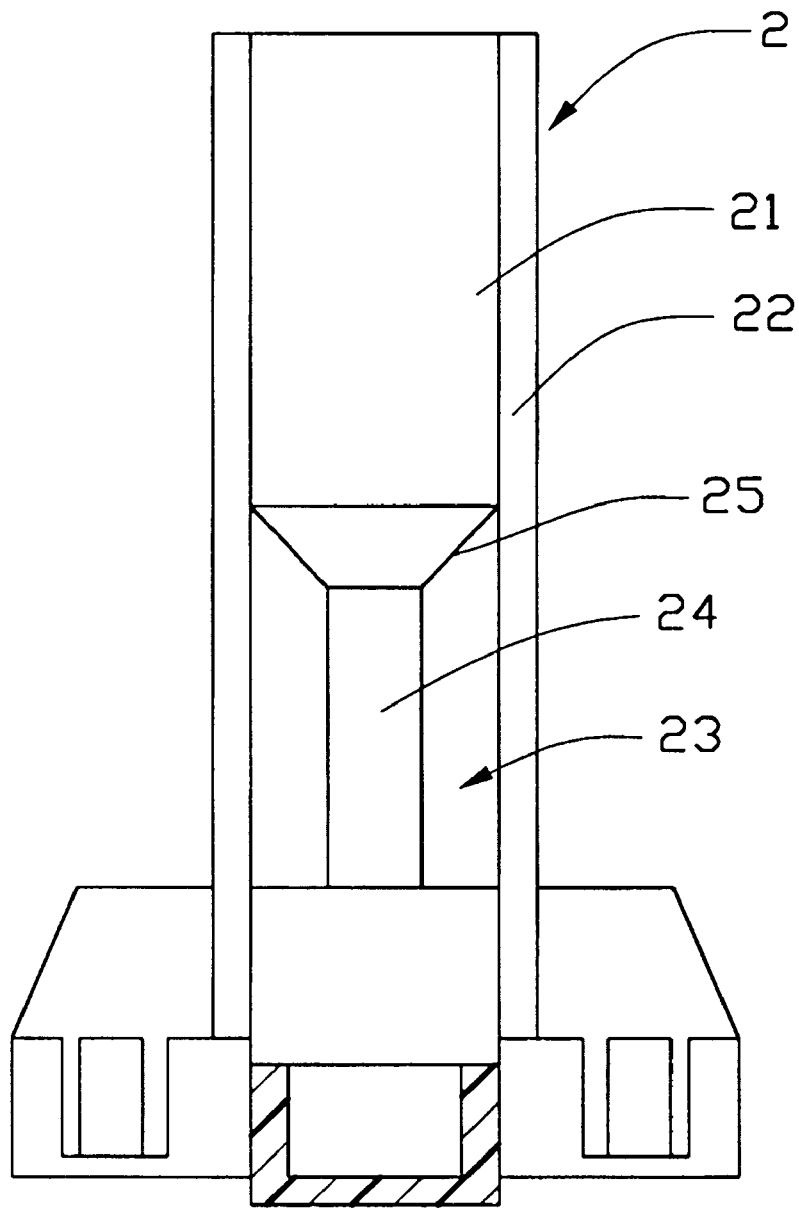
FIG. 3 is a partial cross-sectional side view of the retention mechanism.

Referring to FIGS. 1 to 3, a retention mechanism comprises an elongate base 1, a pair of arms 2 and a pair of locking elements 3. The base 1 has a hollow slot 11 for receiving a connector (not shown) which engages with a CPU package 4. The arms 2 extend from lateral ends of the base 1. Each arm 2 forms a receiving slot 21 for positioning the CPU package 4 therein. A leading element 23 is formed on a side wall 22 of each arm 2. Each leading element 23 comprises a leading slot 24 and a guiding face 25. The width of the leading slot 24 is slightly larger than the thickness of a lateral edge 41 of the CPU package 4; thus the CPU package 4 can be easily inserted into the retention mechanism for being properly positioned in the connector. A pair of cutouts 26 is formed at a free end of each arm 2 and a locking hole 27 is formed in each arm 2.

Each locking element 3 has a body 31, a pair of ear members 32 formed on opposite sides of the body 31, and a pair of projections 33 formed between the ear members 32 and the body 31. A resilient plate 36 extends from a bottom portion 35 of the locking element 3 and a gap 34 is formed between the resilient plate 36 and the body 31. The resilient plate 36 is longer than the body 31. A barb 37 is formed on the resilient plate 36 for engaging with the locking hole 27 of the corresponding arm 2. A positioning slot 38 is formed in the body 31 opposite the resilient plate 36. The positioning slot 38 has the same width as the lateral edge 41 of the CPU package 4 for engaging therewith and properly positioning the CPU package 4 in the connector.

Figure 4:
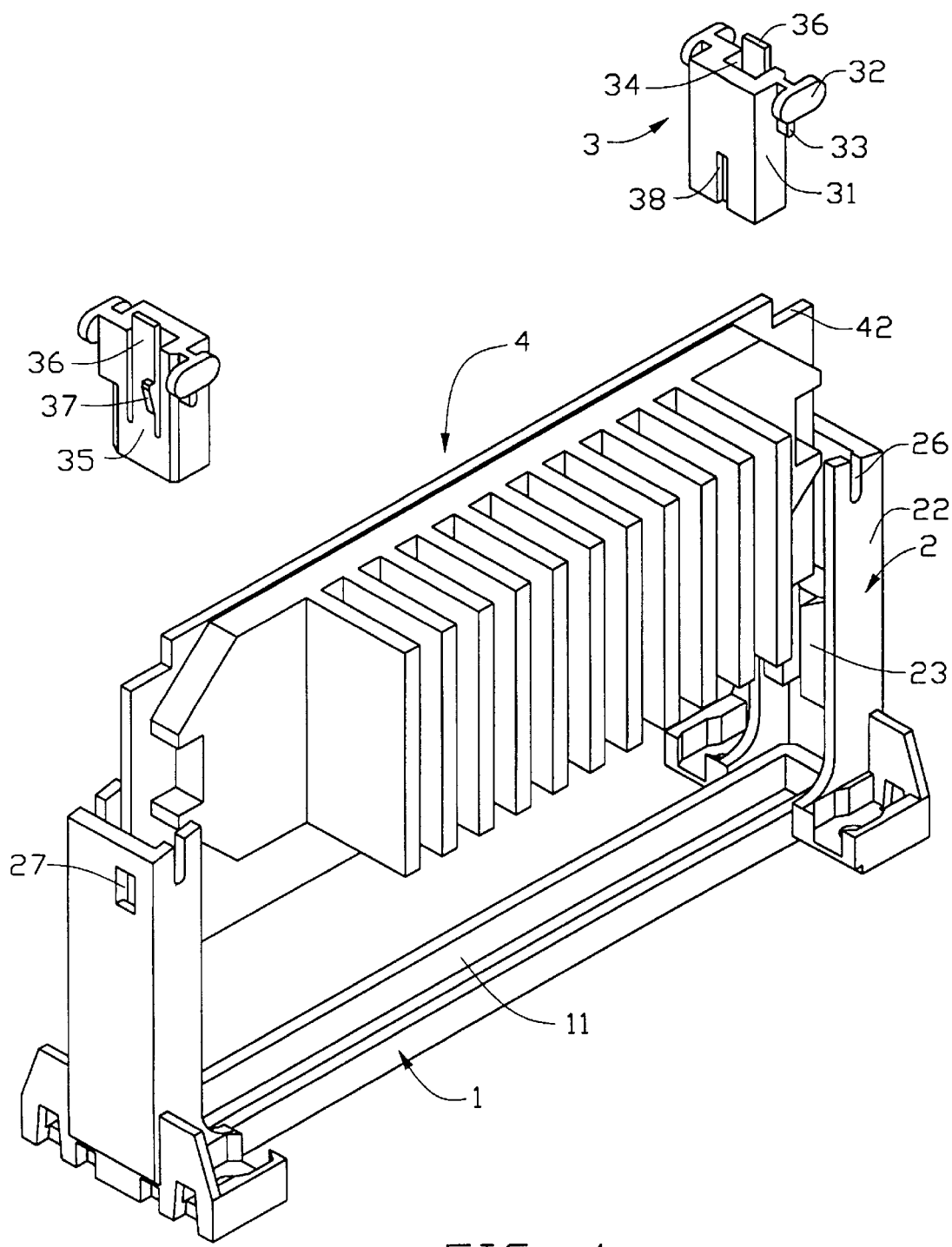
FIG. 4 is a partial assembled view of FIG. 1.
Figure 5:
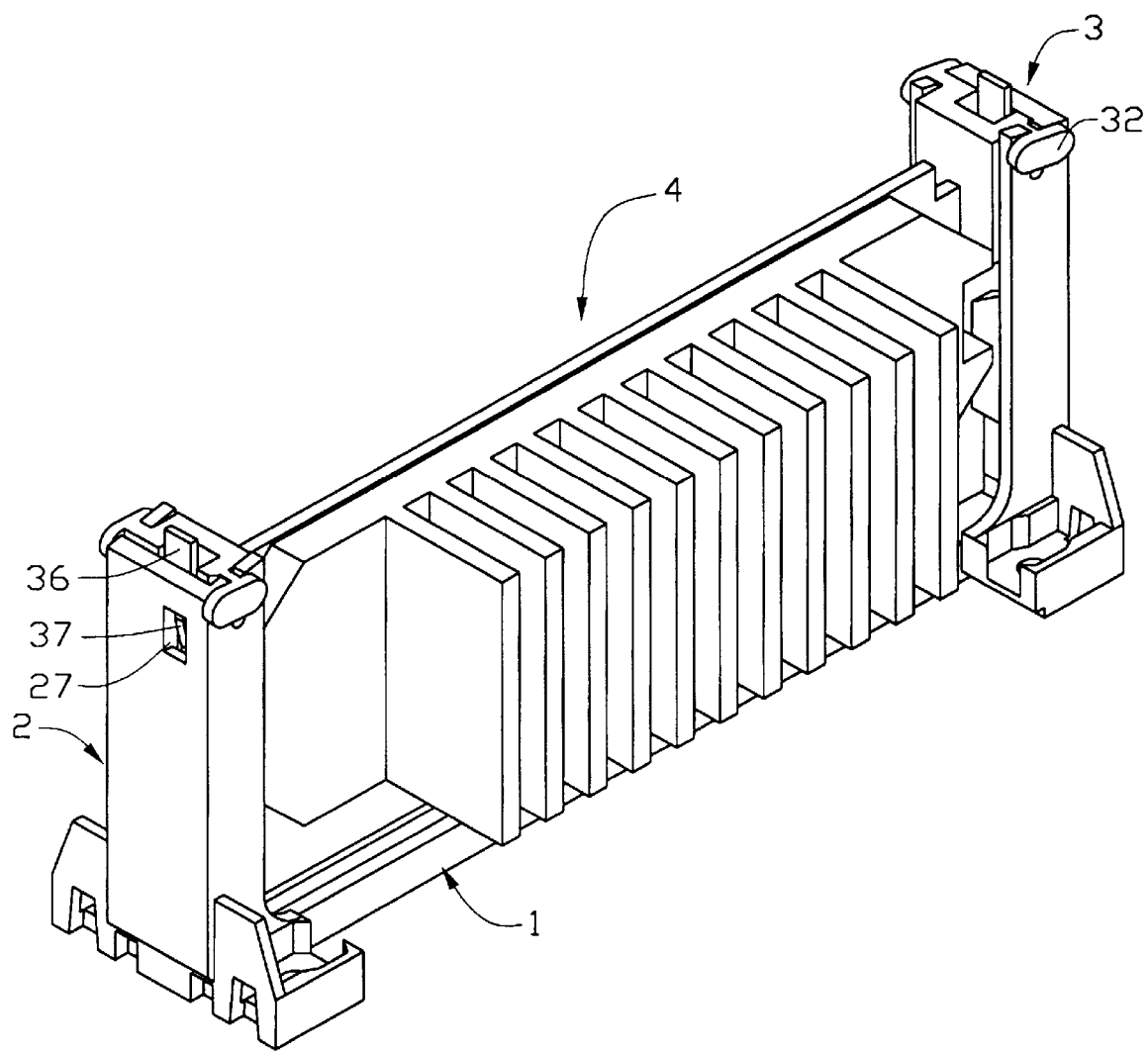
FIG. 5 is an assembled view of FIG. 1.

Referring to FIGS. 4 and 5, the guiding face 25 of the leading element 23 guides the insertion of the CPU package 4 into the leading slot 24 for providing a reliable connection between the CPU package 4 and the connector. After the CPU package 4 is inserted into the leading slot 24, the projection 33 of the locking element 3 engages with the cutout 26, the barb 37 of the resilient plate 36 engages with the locking hole 27, and the positioning slot 38 receives a top edge 42 of the CPU package 4. Thus, the locking elements 3 securely engage with the arms 2 of the retention mechanism for positioning the CPU package 4 in the retention mechanism and providing a reliable connection between the CPU package 4 and the connector.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retention mechanism for receiving a CPU package therein, comprising:

a base with a hollow slot for receiving a connector therein;

a pair of arms vertically extending from opposite ends of the base, each of said arms defining a receiving slot along a lengthwise direction of the arm;

a locking member detachably positioned atop each of said arms and received within a top portion of the corresponding receiving slot for locking the CPU package in the retention mechanism; and a leading element positioned within a middle portion of the receiving slot of each of said arms under the corresponding locking member;

the locking member defining a positioning slot facing inwardly, and the leading element defining a leading slot facing inwardly; the leading slot having an inclined guiding face for facilitating insertion of the CPU package wherein said leading slot is dimensioned to be much narrower than the receiving slot and generally aligned with said positioning slot in a vertical direction; wherein a first width of said leading slot is slightly larger than a thickness of a lateral edge of the CPU package while a second width of said positioning slot is substantially the same as the thickness of the lateral edge of the CPU package.

* * * * *